(12) United States Patent
De Meyer et al.

(10) Patent No.: US 7,998,535 B2
(45) Date of Patent: Aug. 16, 2011

(54) METHOD AND APPARATUS FOR THE PRODUCTION OF METAL COATED STEEL PRODUCTS

(75) Inventors: Marijke De Meyer, Evergem-Sleidinge (BE); Serge Claessens, Deurne (BE); Franz Horzenberger, Assenede (BE)

(73) Assignee: Arcelormittal France (BE)

( * ) Notice: Subject to any disclaimer, the term of this patent is extended or adjusted under 35 U.S.C. 154(b) by 231 days.

(21) Appl. No.: 10/565,097

(22) PCT Filed: Sep. 23, 2004

(86) PCT No.: PCT/EP2004/010673
§ 371 (c)(1),
(2), (4) Date: Jan. 18, 2006

(87) PCT Pub. No.: WO2005/028695
PCT Pub. Date: Mar. 31, 2005

(65) Prior Publication Data
US 2006/0177596 A1  Aug. 10, 2006

(30) Foreign Application Priority Data
Sep. 24, 2003 (EP) .................................... 03447234

(51) Int. Cl.
*C08F 2/46* (2006.01)
(52) U.S. Cl. .................... 427/521; 427/509; 427/528
(58) Field of Classification Search .................. 427/569, 427/509, 521
See application file for complete search history.

(56) References Cited

U.S. PATENT DOCUMENTS

| | | | | |
|---|---|---|---|---|
| 4,980,196 A | * | 12/1990 | Yasuda et al. | 427/539 |
| 5,002,837 A | * | 3/1991 | Shimogori et al. | 428/621 |
| 5,049,453 A | * | 9/1991 | Suemitsu et al. | 428/629 |
| 6,059,935 A | * | 5/2000 | Spence | 204/156 |

FOREIGN PATENT DOCUMENTS

| | | |
|---|---|---|
| DE | 195 27 515 | 11/1996 |
| DE | 19527515 | * 11/1996 |
| DE | 10108926 | 1/2003 |
| EP | 0 060 626 | 2/1982 |
| EP | 0 478 010 | 4/1992 |
| EP | 1201321 | * 5/2002 |
| FR | 2655058 | 11/1989 |
| FR | 2 655 058 | 5/1991 |
| JP | 57155363 A | 9/1982 |
| JP | 58003967 A | 1/1983 |
| JP | 02-194162 | 7/1990 |
| JP | 04 274890 | 9/1992 |
| JP | 2001-035694 | 2/2001 |
| WO | WO 02/14573 | 2/2002 |

* cited by examiner

*Primary Examiner* — Dah-Wei Yuan
*Assistant Examiner* — Robert S Walters, Jr.
(74) *Attorney, Agent, or Firm* — Reinhart Boerner Van Deuren P.C.

(57) ABSTRACT

The present invention is related to a method for the production of metal coated steel products including steps of: providing a steel product with a metal coating; adding an additional metallic element to the metal coating; subjecting the metal coated steel product to a thermal treatment. The method is characterized in that: prior to the addition of the additional element, the steel product is subjected to a plasma treatment via a dielectric barrier discharge, for cleaning and activating the surface of the metal coating; the additional element is added through a physical vapor deposition technique; the thermal treatment is applied by directing high energy infra red radiation towards the outer surface of the metal coating. The present invention is further related to an apparatus including: a component for performing a plasma treatment on a metal coated product; a component for adding an additional element to the metal coating by using a physical vapor deposition technique; a component for directing high energy infra red radiation towards the outer surface of the metal coating.

13 Claims, No Drawings

METHOD AND APPARATUS FOR THE PRODUCTION OF METAL COATED STEEL PRODUCTS

CROSS-REFERENCE TO RELATED PATENT APPLICATIONS

This patent application is the National Stage of International Application No. PCT/EP2004/010673 filed Sep. 23, 2004, that claims the benefit of European Patent Application No. EP 03447234.0 filed Sep. 24, 2003.

FIELD OF THE INVENTION

The present invention is related to the production of metal coated steel products, in particular galvanized or aluminized products, or products having Zn—Al coatings, wherein an additional alloying element such as magnesium is added to the coating, in order to improve the corrosion resistance.

STATE OF THE ART

The best known way of improving the corrosion resistance of steel products is by providing a metallic coating, such as a Zn-coating or an Al-coating. Combined Zn—Al alloy hot dip coated steel sheets, such as Zn+5% Al (Galfan) and Zn+55% Al+1.6% Si (Galvalume) have been developed. These have a higher corrosion resistance than galvanized steel due to having both the corrosion prevention ability of Zn and the passivation ability of Al.

Apart from Al, Mg is also known to have a beneficial effect on corrosion resistance. In particular, the effect of Mg in Zn—Al hot dip coated steel sheet has been proven. Several coatings containing Mg in addition to Zn and Al with improved corrosion resistance have been developed and commercialized. Most of these coatings are produced by bath alloying in the hot dip galvanizing process.

Another approach to produce Mg-alloyed metallic coatings is to start from a hot dip metallic coating (e.g. galvanized Zn—Al or aluminized Al—Si coating) or electrolytically galvanized Zn, and add Mg on top of the coating by means of Physical Vapour Deposition, followed by a thermal treatment in order to diffuse the Mg in the coating and make a Mg-alloyed coating. In that case a thin Mg layer (usually less than 1 μm) is deposited under vacuum. Afterwards this two-layer coating system is diffusion-annealed. In this thermal treatment the Mg diffuses into the metallic coating and forms intermetallic compounds (e.g. $MgZn_2$, $Mg_2Zn_{11}$). As a result the metallic coating is composed of an alloyed coating on top of the conventional metallic coating or of a metallic coating with intermetallic compounds throughout the whole thickness.

This last technique is known for example from document WO-A-0214573, wherein the coating is produced by vacuum deposition of Mg on a Zn-coating, followed by induction heating under protective atmosphere (HNx, $N_2$, He or Ar).

The disadvantage of induction heating is that the heating works from the inner side of the galvanized steel substrate. This results in the fact that there is a risk of galvannealing the Zn-coating, i.e. risking the occurrence of a Fe—Zn reaction. This phenomenon is somewhat delayed in the case of a hot dip galvanised coating, wherein the galvannealing requires the breakdown of the $Fe_2Al_5$ inhibition layer to form Fe—Zn intermetallic compounds. However in the case of an electrogalvanized substrate, the Fe—Zn reaction starts even earlier as there is no Fe—Al intermetallic layer present at the interface steel/zinc. The result of this Fe—Zn reaction is mainly a loss in ductility of the coating.

In the case of Mg-deposition, it is required to clean and activate the coating surface prior to the deposition. In particular, an oxide layer needs to be removed from the surface of hot dip galvanized or aluminized products in order to allow the Mg diffusion into the metallic coating, or a skin pass emulsion may have to be removed in case the Mg-addition takes place after a skin pass, i.e. a hardening rolling step. According to the prior art, this may be done by the process of alkaline degreasing, which is however not a compact process, in the sense that such a degreasing step requires a large physical space in the production line, which is undesirable in terms of efficiency and cost.

Document DE19527515 finally describes a process wherein a plasma treatment precedes a Fe-deposition onto a previously galvanized steel sheet. After the Fe-addition, a heat treatment follows, the precise nature of which is however not identified in the document.

AIMS OF THE INVENTION

The present invention aims to provide a method for the production of metal coated steel products, wherein the coating is applied by hot dip coating or electrolytic coating, mainly galvanizing or aluminizing, followed by a deposition of an additional metallic element, preferably Mg. In the first place, the method of the invention aims to allow a more compact production process, compared to the prior art, as well as a heating step which does not cause the Fe—Zn reaction to take place.

SUMMARY OF THE INVENTION

The present invention is related to a method for the production of metal coated steel products, comprising the steps of:

providing a steel product with a metallic coating,
adding an additional metallic element to said coating, followed by a step of
subjecting said product to a thermal treatment, characterized in that:
prior to the addition of said additional element, said product is subjected to a plasma treatment, for cleaning and activating the surface of said coating,
said additional element is added through a physical vapour deposition technique,
said thermal treatment is applied by directing high energy infra red radiation towards the outer surface of said coating.

According to the preferred embodiment, said metallic coating is chosen from the group consisting of: a Zn-coating, an Al-coating, a Zn—Al coating.

Preferably, said additional metallic element is Mg, and said Mg is added through sputtering or evaporation under low pressure.

According to the preferred embodiment, said plasma treatment is a Dielectric Barrier Discharge (DBD) plasma treatment, taking place at a pressure of between 0.1 bar and 1 bar, under an atmosphere consisting of $N_2$ or of a mixture of $N_2$ and $H_2$. Alternatively, said plasma treatment may take place under vacuum.

Further according to the invention, said thermal treatment may be given under an inert atmosphere or under air.

The method of the invention is preferably applied to a steel sheet. Said infra red radiation may be directed towards one side of said sheet, during a time interval between 5 and 10 s, or to both sides of said sheet, during a time interval between 3 and 8 s.

The energy density of said infra red radiation is preferably at least 400 kW/m$^2$.

The invention is equally related to an apparatus for performing the method of the invention, said apparatus comprising:
- a means for performing a plasma treatment on a metal coated product,
- a means for adding an additional element to said coating by using a physical vapour deposition technique,
- a means for directing high energy infra red radiation towards the outer surface of said coating, after adding said additional element.

DETAILED DESCRIPTION OF THE INVENTION

The method of the invention comprises the following steps, to be performed on a metal coated steel product, preferably a steel sheet which has undergone a hot dip metal coating or electrolytic coating process step:
- cleaning and activating the surface of the coating by subjecting said product to a plasma treatment.
- Depositing an additional metallic element onto said surface by a physical vapour deposition technique, such as sputtering or evaporation.
- After said deposition, subjecting said product to a thermal treatment by applying high energy infra red radiation directed at the coated side of the product.

In the preferred embodiment, the metallic coating consists of a Zn-coating, an Al-coating or a Zn—Al coating, applied by hot dip galvanizing/aluminizing or (in the case of a Zn-coating) electrolytic galvanizing, while the added metallic element is Mg.

According to the invention, the plasma treatment step may take place under vacuum. According to the preferred embodiment however, the plasma treatment is a Dielectric Barrier Discharge plasma treatment, taking place under atmospheric or slightly lower pressure, in practice between 0.1 and 1 bar. In this case, the atmosphere under which the plasma treatment takes place consists of N$_2$ or of a mixture of N$_2$ and H$_2$. Any one of two known configurations for the DBD plasma treatment can be applied, namely the parallel plate configuration and the remote plasma configuration. In the first case the substrate is the second electrode and thus the sheet is treated in the plasma itself. In the second case the sheet is treated by the afterglow of the plasma.

Details about plasma techniques can be found in one or more of the following documents: U.S. Pat. No. 6,051,150, U.S. Pat. No. 6,004,631, WO-A-96/38311, U.S. Pat. No. 5,669,583, DE-A-195 46 187, EP-A-0 467 639, WO-A-01/38596, U.S. Pat. No. 5,384,167.

The physical vapour deposition of Mg onto the coating is performed at low pressure or under vacuum, e.g. by evaporation or sputtering. Evaporation is a technique that allows for higher deposition rates and thus higher line speeds, which are especially favourable if the configuration is installed on an existing electrogalvanizing or hot dip galvanizing/aluminizing line.

According to the invention, the steel product is then subjected to a thermal treatment, by using high energy infra red radiation directed at the coating. This may be performed by a series of high energy infra red lamps, similar to the configurations which are known in the production of painted metal sheets (ref. EP-A-1201321). Preferably, high energy infra red radiation is applied with an energy density of 400 kW/m$^2$ or more. The advantage of this type of heating, apart from its speed, is the fact that the steel product is heated from the outside. Consequently, the Mg-diffusion into the Zn or Al coating starts easier from the surface without affecting the interface between the steel substrate and the Zn— or Al coating. The use of high energy infra red for the thermal treatment of metal coated products is not known so far, which is mainly due to the fact that without the additional metal-addition (such as Mg), the aspect of the coatings is more reflective, which would not allow the radiation to be absorbed in a sufficient manner for the required heating to take place. The deposited Mg lends a non-reflective aspect to the coating, allowing an efficient heat absorption when applying the high energy infra red.

According to the invention, the high energy infra red treatment may take place under (air) atmospheric conditions, or in the presence of an inert gas. The latter alternative provides the advantage that the temperature at the end of the deposition step is less critical, given that in inert circumstances there is no danger of oxide formation, when the temperature exceeds a given limit. The high energy infra red radiation may be applied to one side of the steel sheet, or to both sides. The time during which the radiation is applied preferably lies between 5 and 10 s for one-sided heating and between 3 and 8 s for two-sided heating. The exact radiation time primarily depends on the thickness of the steel sheet.

Because of the application of the plasma treatment and of the high energy infra red heating, the method of the invention is much more compact, i.e. it requires less physical space then prior art processes, which allows it to be incorporated into existing metal coating production lines more easily.

The invention claimed is:

1. A method for the production of metal coated steel products, comprising the steps of:
   providing a steel product with a metallic coating;
   diffusing an additional metallic element into said metallic coating to form an intermetallic compound wherein said additional metallic element is Mg;
   wherein said steel product is subjected to a plasma treatment prior to the addition of said additional metallic element for cleaning and activating the surface of said metallic coating;
   wherein said additional metallic element is added through a physical vapour deposition technique; and
   wherein thermal treatment is applied by directing high energy infra red radiation towards the outer surface of said metallic coating, the thermal treatment heating the steel product from outside to diffuse the additional metallic element into the metallic coating without affecting an interface between the steel substrate and the metallic coating.

2. The method according to claim 1, wherein said metallic coating is chosen from the group consisting of: a Zn-coating, an Al-coating, a Zn—Al coating.

3. The method according to claim 1, wherein said Mg is added through sputtering or evaporation under low pressure.

4. The method according to claim 1, wherein said plasma treatment is a Dielectric Barrier Discharge (DBD) plasma treatment, taking place at a pressure of between 0.1 bar and 1 bar, under an atmosphere consisting of N$_2$ or of a mixture of N$_2$ and H$_2$.

5. The method according to claim 1, wherein said plasma treatment takes place under vacuum.

6. The method according to claim 1, wherein said thermal treatment is given under an inert atmosphere.

7. The method according to claim 1, wherein said thermal treatment is given under air.

8. The method according to claim 1, wherein said product is a steel sheet.

9. The method according to claim 8, wherein said infra red radiation is directed towards one side of said sheet, during a time interval between 5 and 10 s.

10. The method according to claim 1, wherein said infra red radiation is directed towards both sides of said sheet, during a time interval between 3 and 8 s.

11. The method according to claim 1, wherein the energy density of said infra red radiation is at least 400 kW/m$^2$.

12. The method according to claim 1, wherein the infra red radiation thermal treatment is applied before application of any organic coating on the metal coated surface.

13. The method of claim 1, further comprising providing an apparatus for accomplishing the method, the apparatus including:
- a means for performing a plasma treatment on a metal coated product;
- a means for adding an additional element to said coating by using a physical vapour deposition technique; and
- a means for directing high energy infra red radiation towards the outer surface of said coating, after adding said additional element.

* * * * *